United States Patent
Mohammad et al.

(10) Patent No.: US 12,216,026 B2
(45) Date of Patent: Feb. 4, 2025

(54) LOW POWER MEMRISTIVE VACUUM SENSOR

(71) Applicant: Khalifa University of Science and Technology, Abu Dhabi (AE)

(72) Inventors: Baker Mohammad, Abu Dhabi (AE); Khaled Muneer Mutlaq Humood, Edinburgh (GB); Maguy Abi Jaoude, Abu Dhabi (AE); Sueda Saylan, Goztepe (TR)

(73) Assignee: Khalifa University of Science and Technology, Abu Dhabi (AE)

( * ) Notice: Subject to any disclaimer, the term of this patent is extended or adjusted under 35 U.S.C. 154(b) by 71 days.

(21) Appl. No.: 17/840,335

(22) Filed: Jun. 14, 2022

(65) Prior Publication Data

US 2022/0412836 A1    Dec. 29, 2022

Related U.S. Application Data (60) Provisional application No. 63/216,438, filed on Jun. 29, 2021.

(51) Int. Cl.
*G01M 3/32* (2006.01)
*G01M 3/34* (2006.01)
*H10N 70/00* (2023.01)

(52) U.S. Cl.
CPC .......... *G01M 3/3236* (2013.01); *G01M 3/34* (2013.01); *H10N 70/841* (2023.02); *H10N 70/8833* (2023.02)

(58) Field of Classification Search
CPC ........ G01M 3/26; G01M 3/32; G01M 3/3236; G01M 3/34
See application file for complete search history.

(56) References Cited

U.S. PATENT DOCUMENTS 8,063,395 B2 *   11/2011   Xia ................... H10N 70/884
                                                      438/666
8,250,927 B2 *   8/2012   Anand ................... G01B 7/18
                                                      73/777

(Continued)

FOREIGN PATENT DOCUMENTS

WO    WO-2017115340 A1 *   7/2017   ............... G01T 1/02

OTHER PUBLICATIONS

K. Allidina, M. A. Taghvaei, F. Nabki, P. Cicek, and M. N. El-Gamal, "A MEMS-based vacuum sensor with a PLL frequency-to-voltage converter," in 2009 16th IEEE International Conference on Electronics, Circuits and Systems—(ICECS 2009), 2009, pp. 583-586.

(Continued)

*Primary Examiner* — Erika J. Villaluna
(74) *Attorney, Agent, or Firm* — Kilpatrick Townsend & Stockton LLP (57) ABSTRACT

Techniques for measuring vacuum pressure using a memristor element are described. A vacuum sensor can include a memristor element having a semiconductor substrate, a memristive material layer, and a conductive electrode. The off-state resistance of the memristor element can be sensitive to changes in ambient pressure at the element. The off-state resistance of the memristor element may also exhibit a well-defined increase at pressures below a threshold pressure. Measurement of the off-state resistance may be obtained with low power consumption and without changing the resistance or switching the state of the memristor element. The measurements may be used to both determine a leak rate of the ambient pressure within the volume of interest and determine if the sensor is exposed to vacuum pressure below the threshold pressure.

18 Claims, 8 Drawing Sheets

(56) References Cited

U.S. PATENT DOCUMENTS 10,520,340 B2 * 12/2019 Bessonov ............... G01D 21/00
2019/0198617 A1 * 6/2019 Li ....................... H01L 29/1054

OTHER PUBLICATIONS

B. Wang, et al., "Development of a Piezoelectric Vacuum Sensing Component for a Wide Pressure Range," Sensors, 14, 2014, pp. 22099-22112.

P. Nicolay et al., "SAW pressure sensor for vacuum control applications," in 2009 IEEE International Frequency Control Symposium Joint with the 22nd European Frequency and Time forum, 2009, pp. 106-109.

M. Purahmad et al., "A MEMS-based resistive vacuum gauge with voltage readout," in 2013 26th International Vacuum Nanoelectronics Conference (IVNC), 2013, pp. 1-2.

M. Piotto, S. Del Cesta, and P. Bruschi, "A Compact CMOS Compatible micro-Pirani Vacuum Sensor with Wide Operating Range and Low Power Consumption," Procedia Engineering, vol. 168, pp. 766-769, Jan. 1, 2016 2016.

S. J. Chen and Y. C. Wu, "Dual Phase Modulation of CMOS-MEMS Vacuum Sensor," in 2019 IEEE Eurasia Conference on IOT, Communication and Engineering (ECICE), 2019, pp. 1-4.

Y. Sun, K. Liang, C. Cheng, M. Lin, R. Chen, and W. Fang, "Performance improvement of CMOS-MEMS Pirani vacuum gauge with hollow heater design," in 2015 Transducers—2015 18th International Conference on Solid-State Sensors, Actuators and Microsystems (Transducers), 2015, pp. 1069-1072.

* cited by examiner

LOW POWER MEMRISTIVE VACUUM SENSOR

CROSS-REFERENCES TO RELATED APPLICATIONS

This application claims the benefit of U.S. Provisional Application No. 63/216,438, filed Jun. 29, 2021, the entire contents of which are hereby incorporated for all purposes in their entirety.

BACKGROUND

Micrometeoroids and orbital debris (MMOD) with diameters ranging from 25 mm to 125 mm and traveling at approximately 9-10 km/s in the Low Earth Orbit (LEO) frequently impact and damage the International Space Station (ISS) and other space-based structures. Such events can cause ambient pressure (e.g., oxygen), fuel, or heat leaks, which are among major concerns for the integrity of pressurized space structures and safety of astronauts. Current on-board detection solutions include optical sensing, pressure measurement, mass balance, magnetic induction, and ultrasonic acoustics The various existing solutions to sense changes in the pressure from atmospheric pressure (approximately 760 Torr) down to high vacuum (approximately $6.5 \times 10^{-6}$ Torr) operate at high power and/or require heavy and large circuitry to be used. Accordingly, a low-power, light weight vacuum sensor is desirable.

BRIEF SUMMARY

Embodiments of the present disclosure include a pressure detection system that combines a memristor element with a controller and an indicator to provide low-power, light-weight, and small-form-factor vacuum pressure sensing with high sensitivity over a large range of ambient pressure values. The memristor element can be formed from a semiconductor substrate, a transition metal oxide layer coupled to the semiconductor substrate, and a conductive top electrode formed on the transition metal oxide layer and defining a sensor area. The memristor element can exhibit non-volatile resistive switching between a high resistance state and a low resistance state. The characteristic resistance of the high resistance state (the off-state) may be sensitive to the ambient pressure at the memristor element. Measuring the off-state resistance of the memristor element may be done in a way that does not switch the memristor's state or significantly alter the off-state resistance. Such measurements can consume extremely low power.

Another embodiment is directed to a method for using a vacuum sensor to measure a decrease in the ambient pressure (a leak rate) or determine if the vacuum sensor is exposed to vacuum (a highvacuum state). The method can include providing the vacuum sensor in the volume to be monitored, sending a readout signal to the sensor, receiving a corresponding output signal from the sensor, then using the output signal to determine the off-state resistance and/or corresponding ambient pressure. The off-state resistance of the memristor element at standard atmospheric pressure may be known or predetermined and used as a reference for comparing with the off-state resistance of the element when under vacuum.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced in other configurations, or without the specific details. Furthermore, well-known features may be omitted or simplified in order not to obscure the embodiment being described.

Emerging memristor (MR) technologies play an important role in electronic applications due to their low power consumption, small footprint, structure-dependent binary or multi-level switching behavior, and fast switching speed compared to existing complementary metal-oxide semiconductor (CMOS) technologies. The simple two-terminal structure of memristive devices enables the fabrication of dense crossbar arrays that can be used to realize an extremely small bit area in memory systems. The resistive switching (RS) property of MRs has also been exploited for the development of advanced applications such as matrix multiplication, in-memory computing (IMC), and hardware-accelerated processing. Moreover, the capacity to stimulate the resistive switching behavior by altering the external biological, chemical, or physical environment (rather than the applied electric field), is promising for expanding the use of memristors as sensing elements.

Memristors are a class of resistive switching memory devices whose resistance depends on the previous history of an applied electric field across the device. Memristor devices typically include a memristive material disposed between two conductive layers or between an electrode and semiconductor layer. The memristive material may be a transition metal oxide, perovskite, nitride, or other similar materials. When subject to an applied electric field (e.g., a voltage), the resistance of the memristive material can change and will be maintained after the applied field is removed. In addition, the memristive material may exhibit bistable resistive switching between a high resistance state (HRS) and a low resistance state (LRS) that can be cycled by repeated application of an applied electric field. The resistance value of an MR device (e.g., the value in the HRS) may be subsequently measured (e.g., with an applied voltage) and repeatably set/reset to that value.

Certain MRs (e.g., redox-based memristive materials) have parameters, including the stateful resistance values $R_{off}$ (e.g., the HRS resistance) and $R_{on}$ (e.g., the LRS resistance), that are sensitive to external environmental conditions. More specifically, memristive materials may be sensitive to ambient pressure. For example, an MR may have an $R_{off}$ that increases for decreasing pressure. Measurements of $R_{off}$ may then be a reliable and repeatable method for tracking changes in the ambient pressure at the sensor (e.g., gas leaks out of or into a vessel). In addition, memristive materials may exhibit a sharp and well-defined increase in $R_{off}$ below a threshold pressure near "high-vacuum" (approximately $1 \times 10^{-6}$ Torr). The increase in the HRS resistance of MRs at high vacuum can allow measurements of $R_{off}$ to be reliable indicators of a "high-vacuum" pressure at the MR relative to atmospheric pressure.

This disclosure relates to, among other things, systems, methods, and devices that include a memristor sensor for detecting vacuum pressure and/or air or other gas leaks. The MR sensor may be a semiconductor device that includes a memristive material layer between a semiconductor substrate and a conductive layer acting as an electrode. The memristive material may be a transition metal oxide, including hafnium dioxide ($HfO_2$). As described herein, the MR device may include a p-type silicon layer ($p^+$—Si), an $HfO_2$ layer formed on the $p^+$—Si layer, and a copper (Cu) layer on the $HfO_2$ layer as one embodiment. Such MR device can be connected to a low-power microcontroller that is configured to determine the $R_{off}$ of the device and provide an indication of a leak rate and/or a vacuum pressure at the device.

Numerous advantages can be provided by the MR-based vacuum pressure sensor of present disclosure over conventional pressure sensing techniques, as detailed in Table 1, below. An MR sensor may exhibit high pressure sensitivity (approximately 493 $Torr^{-1}$) over a wider range of ambient pressure values (approximately $4.9 \times 10^{-5}$-760 Torr) than other sensors. The MR sensor $R_{off}$ value can respond quickly to decreases in ambient pressure, and the sensor's detection functionality is repeatable. The MR vacuum sensor reduces power consumption by three orders of magnitude over conventional sensors, while also providing a small footprint for spatially constrained applications (e.g., in a spacecraft, spacesuit, etc.). Systems that incorporate the MR sensor may be similarly low power (e.g., a low power microcontroller). In addition, the sensor does not depend on temperature or frequency changes and is therefore less susceptible to noise and interference.

TABLE 1

Comparison Between the Proposed MR Sensor and Other Pressure Sensors Reported in the Literature

| | Sensor | Pressure range | Power | Sensor Area | Sensing Mechanism | Circuitry |
|---|---|---|---|---|---|---|
| Work | Mechanical resonator | 7.5-900 Torr | 520 μW | 350 × 130 μm² | Mechanical | Sensor + Amplifier + Frequency Detector + Charge Pump + Filter + VCO |
| | Piezoelectric beam structure | $6.5 \times 10^{-6}$-760 Torr | — | 20 × 20 mm² | Mechanical | Sensor + Amplifier + Function Generator + Spectrum Analyzer |
| | Surface acoustic wave | $1 \times 10^{-4}$-$1 \times 10^3$ Torr | — | 7 × 5 mm² | Mechanical | Sensor + Network Analyzer HP8752A |
| | Ni resistor | $1 \times 10^{-5}$-1 Torr | 0.5 mW | 0.4 × 1 mm² | Thermal | — |
| | tungsten resistor | $7.5 \times 10^{-3}$-750 Torr | 0.05 W | 40 × 40 μm² | Thermal | Sensor + Heater + Voltage Source + Amplifier + 8 Bit SAR A/D Converter |
| | micro-Pirani | $2.2 \times 10^{-3}$-750 Torr | 3.56 mW | 200 × 200 μm² | Thermal | — |
| | Thermoelectric | $1 \times 10^{-2}$-10 Torr | — | 800 × 800 μm² | Thermal | Sensor + Power Supply + Function Generator + Chopper and PLL Amplifiers + Filter |
| | Pirani with hollow heater | 0.8-200 Torr | 180 μW | 206 × 82 μm² | Thermal | — |
| This work | Memristor | $4.9 \times 10^{-5}$-760 Torr | 8 nW | 2 × 2 mm² | Electrical | Sensor + Arduino microcontroller + LPF |

Figure 1:
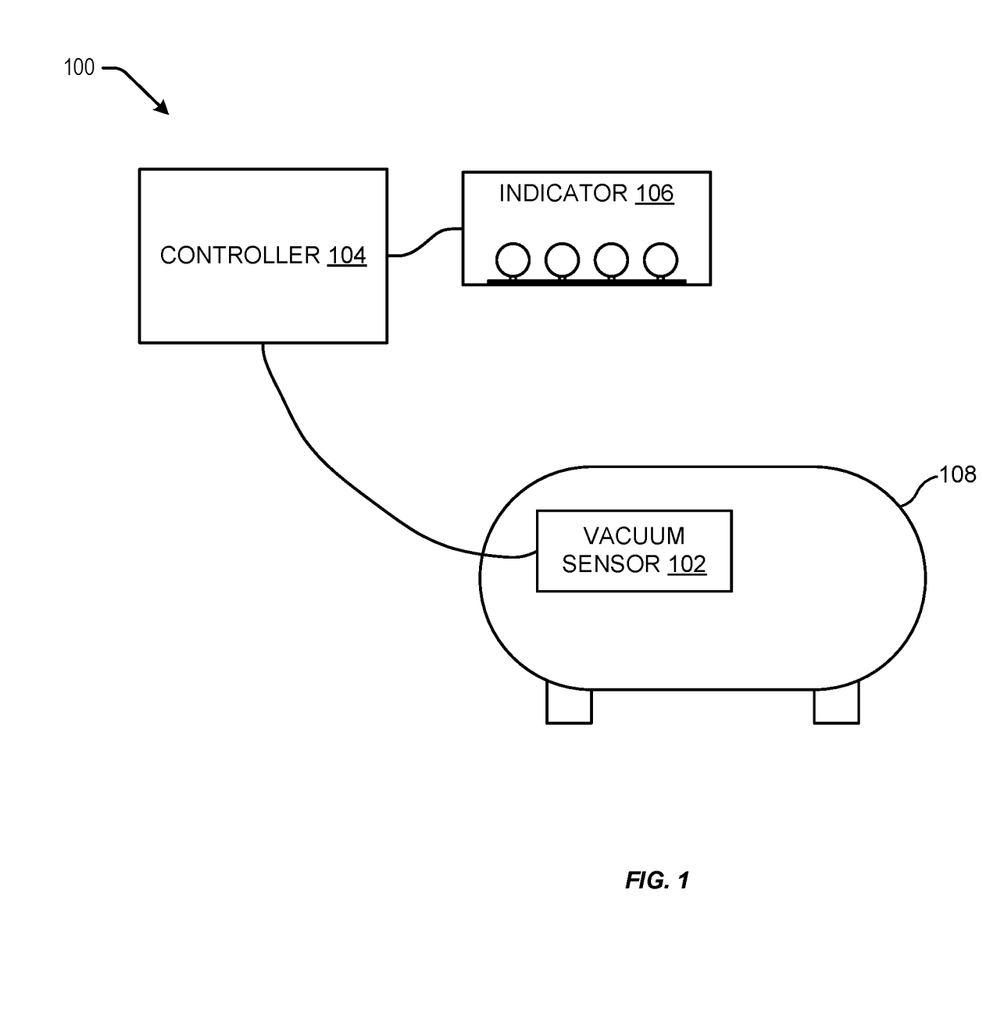
FIG. 1 shows a simplified block diagram of an example system including a memristive vacuum sensor, according to at least one embodiment.

Turning now to the figures, FIG. 1 shows a simplified block diagram of an example pressure detection system 100 including a memristive vacuum sensor 102, according to at least one embodiment. The pressure detection system 100 can include a controller 104 electrically coupled to the vacuum sensor 102. The pressure detection system 100 can also include an indicator 106 electrically coupled to the controller 104. As used herein, electrical coupling may be by direct (e.g., physical contact of electrically conductive components) or indirect electrical connections.

The controller 104 may be a programmable microcontroller. Suitable microcontrollers may be commercially available and may include, for example, Arduino single-board controllers or other similar controllers. The controller 104 may be configured to send one or more signals (e.g., electrical signals, voltage pulses, etc.) to the vacuum sensor 102. The signals sent by the controller 104 may be used to perform SET/RESET operations on the vacuum sensor 102. For an MR device (e.g., vacuum sensor 102) exhibiting resistive switching, the SET and RESET operations can include applying a sufficient voltage across the device in either a forward-biased or reverse-biased configuration to switch the device between the LRS and HRS. After a RESET operation, the MR device may be in the FIRS and have a characteristic resistance $R_{off}$. The signals sent by the controller 104 may be a readout signal to determine the value of $R_{off}$ when the MR device is in the HRS. For example, the controller 104 may send a short duration voltage pulse (e.g., square-wave pulse), which can result in a corresponding current passing through the MR device. The current may be detected by the controller 104 and used to determine the value of $R_{off}$.

The controller 104 may be configured to perform one or more operations for determining $R_{off}$ from respective voltage and/or current measurements. The controller 104 may compare $R_{off}$ to a resistance value at a threshold pressure to determine if the MR device (e.g., vacuum sensor 102) is in a vacuum. The controller 104 may also compare a series of $R_{off}$ measurements to determine if the $R_{off}$ values are increasing over time. The rate of increase in $R_{off}$ may be indicative of a change in ambient pressure over time (e.g., a leak), and the rate of the increase may correspond to the rate of the leak. The controller 104 may be configured to operate one or more indicators (e.g., indicator 106), which can include sending indication signals related to the state of the vacuum sensor 102 (e.g., in a vacuum, experience a leak) to the indicators.

The vacuum sensor 102 can include one or more MR devices. In one embodiment, the vacuum sensor 102 can include a Cu/HfO$_2$/p$^+$—Si device. The vacuum sensor 102 may be connected to the controller 104 so that the controller 104 can apply an electrical signal across the MR device. For example, controller may be connected to the copper top electrode and the silicon layer so that a voltage is applied between the copper electrode and the silicon layer across the HfO$_2$ memristive material. In some embodiments, more than one MR device may be arrayed together on the same silicon substrate to form multiple MR devices. The controller 104 may be configured to send the same or separate electrical signals to each MR device in order to determine the $R_{off}$ values for each device. Having multiple MR devices in a vacuum sensor 102 may be useful for redundancy and for providing consistent measurement values.

As shown in FIG. 1, the vacuum sensor 102 may be positioned inside a vessel 108 or any other suitable volume for measuring vacuum pressure. The vessel 108 may represent a vacuum chamber, a spacecraft, a spacesuit, or any other volume that may have an ambient pressure that can be reduced to create a vacuum environment. In some embodiments, the vessel 108 may be a normally pressurized environment (e.g., approximately 760 Torr ambient pressure) within a larger vacuum environment. For example, the vessel 108 may be a spacecraft module in orbit. In another example, the vessel 108 may be a pressurized volume (e.g., a pressurized test cell) inside a larger vacuum chamber, such that the pressurized volume is intended to remain at a pressure higher than the vacuum chamber when the vacuum chamber is evacuated.

The vacuum sensor 102 can be used to detect leaks (e.g., air/gas leaks) out from a volume (e.g., vessel 108) when those leaks reduce the ambient pressure of the volume to below approximately 760 Torr (approximately 1 atm). As described in more detail below with respect to FIG. 4, an MR device of the vacuum sensor 102 may exhibit an $R_{off}$ value that depends sensitively on the ambient pressure at the MR device. By repeatedly measuring $R_{off}$ in a reverse-biased configuration (e.g., without switching the MR device to the LRS state), measured changes in $R_{off}$ may correspond to a change in the ambient pressure (e.g., due to a leak). The pressure sensitivity of the MR device allows for the pressure detection system 100 to determine if the measured leak rate is above a predetermined threshold rate.

Additionally, the vacuum sensor 102 can be used to detect a high vacuum state of a volume (e.g., vessel 108). As described with respect to FIG. 4, an MR device of the vacuum sensor 102 may exhibit a sharp and well-defined increase in $R_{off}$ below a critical pressure threshold. The threshold pressure may differ slightly for different MR devices composed of the same memristive material. However, the increase in $R_{off}$ for an MR device in ambient pressure below the threshold pressure may be sufficiently large to indicate crossing an empirically derived threshold pressure with high confidence.

The indicator 106 may be configured to receive an indication signal from the controller 104 and display an indication corresponding to the indication signal. The indicator 106 may be any suitable device for receiving signals and presenting corresponding indications, including, but not limited to, lights, light arrays, screens, monitors, speakers (to produce audio indications), and the like. In some embodiments, the indicator 106 may be a light emitting diode (LED). The indication signal can then be a voltage signal to turn the LED on and indicate a state of a vacuum sensor. In some embodiments, the indicator may be an array of LEDs configured to receive one or more indication signals. For example, a first indication signal may turn on a first LED indicating a leak within the vessel 108 containing the vacuum sensor 102. A second indication signal may turn on a second LED indicating that the pressure in vessel 108 has fallen below a threshold pressure and is now at "high-vacuum."

Figure 2:
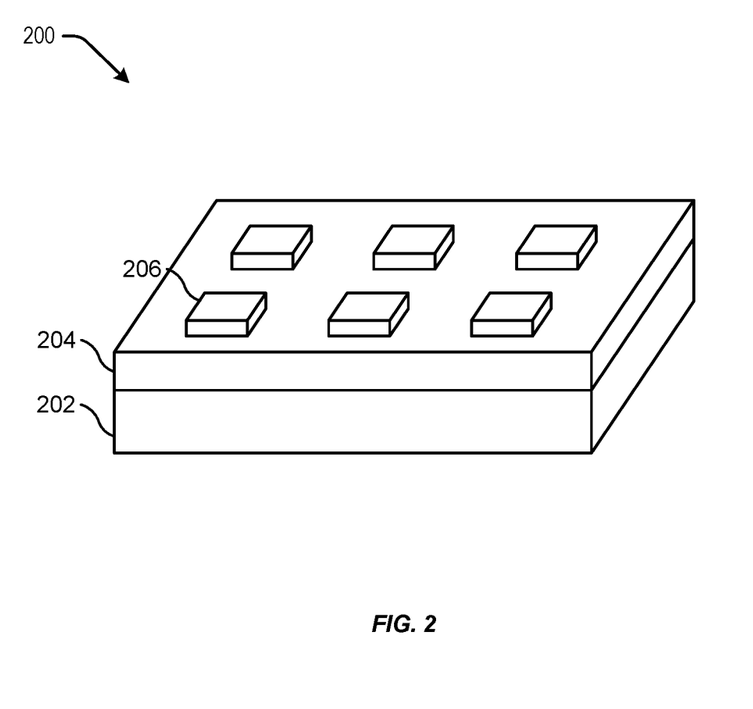
FIG. 2 is a diagram depicting an array of memristor devices, according to at least one embodiment.

FIG. 2 is a diagram depicting an array 200 of memristor devices, according to at least one embodiment. The MR devices of the array 200 may be an example of the sensing element of a vacuum sensor (e.g., vacuum sensor 102 of FIG. 1). The array may be formed from a semiconductor layer 202, a memristive material layer 204 coupled to the semiconductor layer 202, and a plurality of conductive elements 206 coupled to the memristive material layer 204. The area covered by each conductive element 206 may define a single MR device, such that each MR device is defined as the column of material under and including the conductive element 206. The array 200 may have more or fewer conductive elements 206 than shown in FIG. 2.

In an embodiment, the semiconductor layer 202 can be a p-type silicon layer (p$^+$—Si), the memristive material layer 204 can be a hafnium dioxide (HfO$_2$) layer, and the conductive elements 206 can be copper (Cu) electrodes formed on the HfO$_2$ layer. The Cu conductive elements 206 may be square with dimensions of about 2 mm×2 mm (an area of each device of about 4 mm$^2$). Other shapes and dimensions of the Cu conductive elements are contemplated, including circular elements and/or rectangular elements. As used herein with respect to dimensions or other quantities, the term "about" means to be within a certain predefined range, such as a range of an acceptable manufacturing tolerance margin or other predefined range (e.g., +/−10%) as known to a person of ordinary skill in the art. The Cu conductive elements 206 may be deposited by sputtering through a shadow mask with openings dimensioned for the resulting sensor area (e.g., 2 mm×2 mm). The HfO$_2$ memristive material layer 204 may be formed by spin-coating or similar method. The HfO$_2$ memristive material layer 204 may be about 80 nm thick. The p$^+$—Si semiconductor layer 202 may be about 650 µm thick. Other thicknesses of the HfO$_2$ memristive material layer 204 and the p$^+$—Si semiconductor layer 202 are contemplated. For example, the HfO$_2$ memristive material layer 204 may be less than 80 nm thick (e.g., 40 nm, 60 nm, 70 nm, etc.) or greater than 80 nm thick (e.g., 90 nm, 100 nm, 120 nm, etc.), while the p$^+$—Si semiconductor layer 202 may be less than 650 µm thick or greater than 650 µm thick.

Figure 3:
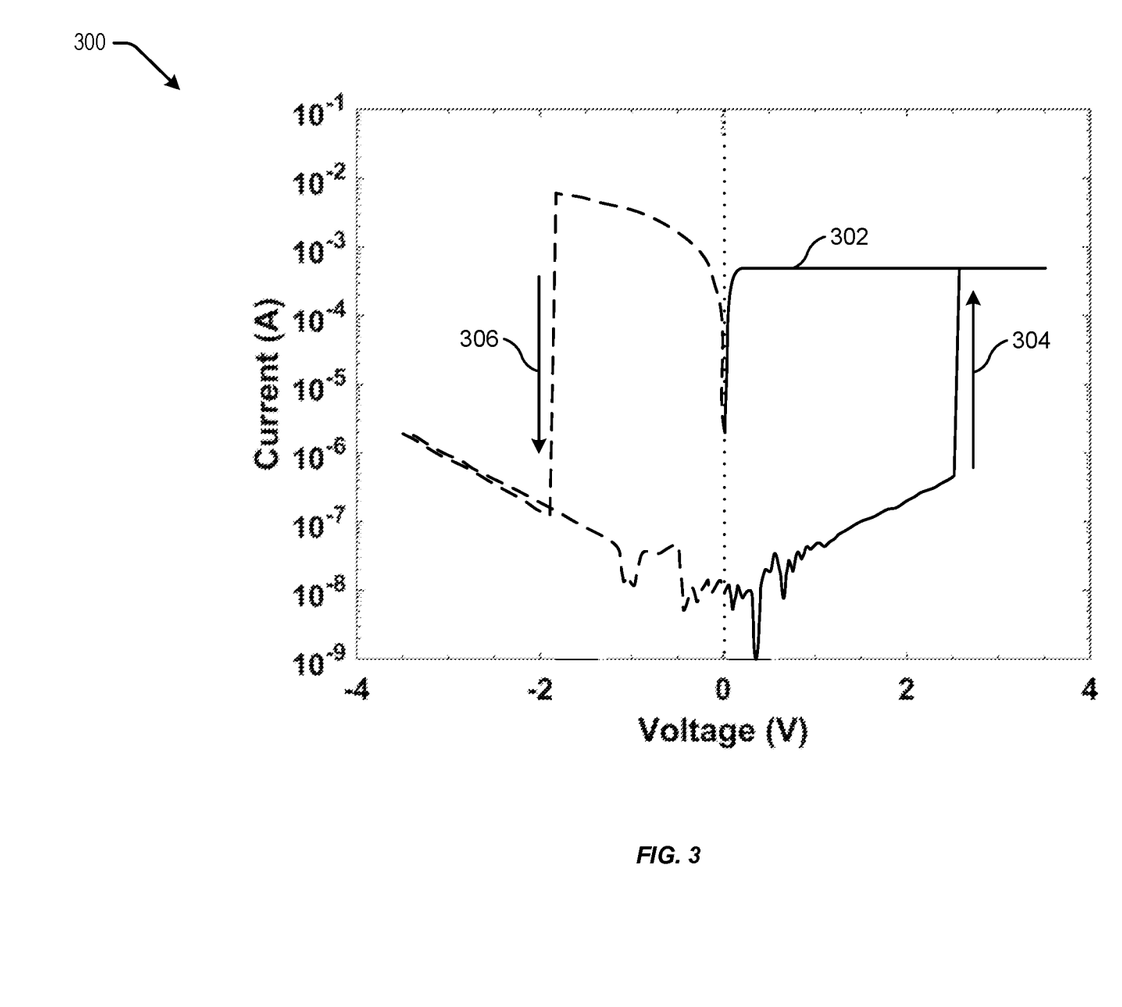
FIG. 3 shows an example I-V plot for a memristor device for SET and RESET configurations, according to at least one embodiment.

FIG. 3 shows an example I-V plot 300 (current versus voltage) for a memristor device for SET and RESET configurations, according to at least one embodiment. The MR device may be one of the devices of the array 200 of FIG. 2, including a Cu/HfO$_2$/p$^+$—Si device. The plot 300 corresponds to I-V characteristics of an example MR device at standard temperature and pressure (e.g., 20° C. and approximately 760 Torr). Dual positive sweeps ranging from 0 to 3.5 V and 0 to −3.5 V were applied for the SET and RESET operations, respectively, with a voltage step size of 0.05 V in both cases. The p+—Si layer was grounded during both operations.

The plot 300 shows the characteristics of a device that exhibits bipolar resistive switching within a bias voltage sweep window of +3.5 to −3.5 V. Unlike typical MR devices that operate under an electrochemical metallization (ECM) mechanism, the device characterized by FIG. 3 may not need an electroforming step. Arrows 304 and 306 indicate the direction of the path for the SET and RESET sweeps, respectively. During the SET sweeps, a compliance current 302 of 500 µA was maintained to avoid the permanent breakdown of the memristive material (e.g., HfO$_2$ memristive material layer 204 of FIG. 2).

Figure 4:
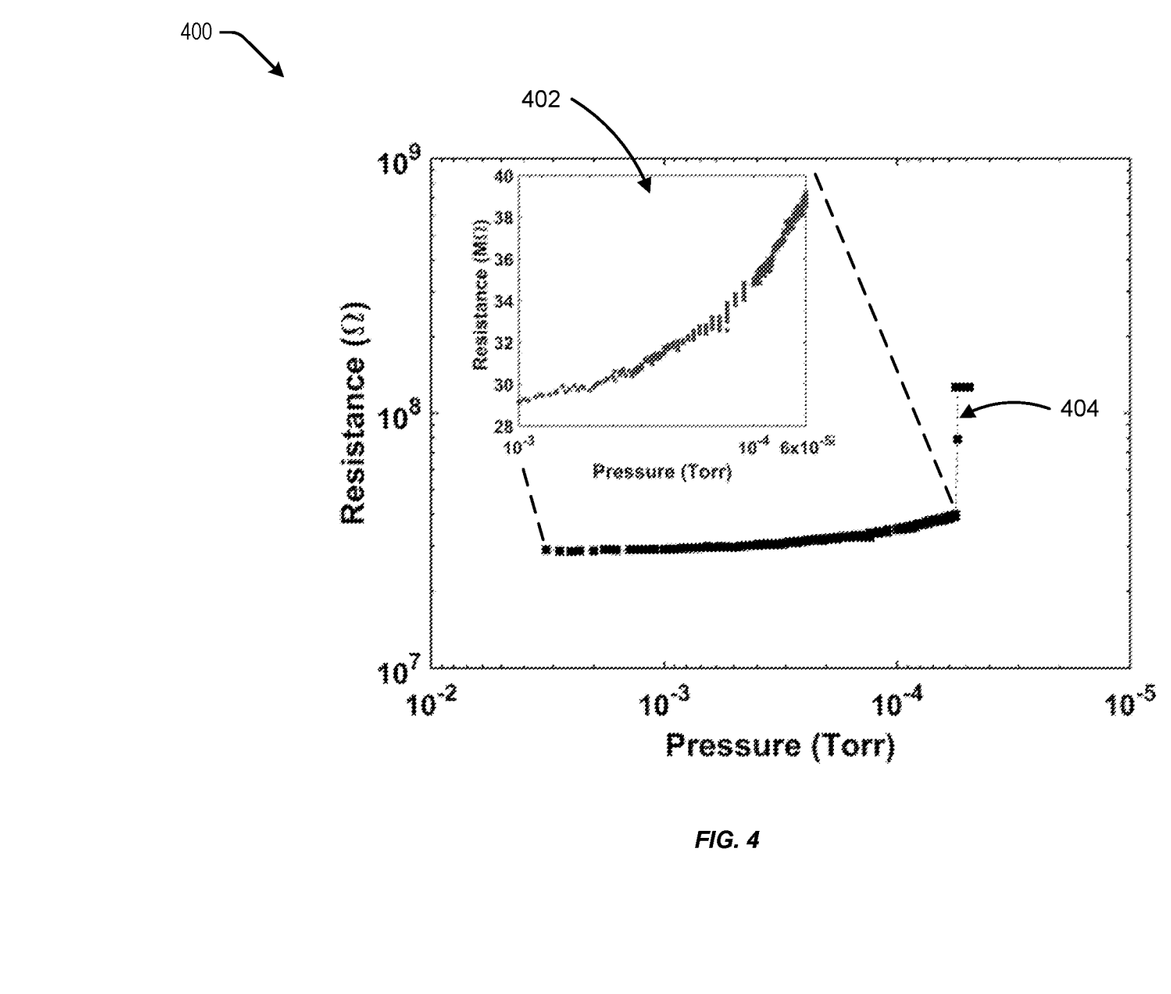
FIG. 4 shows an example plot of device resistance versus pressure for a memristive vacuum sensor, according to at least one embodiment.

FIG. 4 shows an example plot 400 of device off-state (e.g., HRS) resistance R$_{off}$ versus pressure for a memristive vacuum sensor, according to at least one embodiment. The memristive vacuum sensor may be an example of vacuum sensor 102 of FIG. 1, and may be an MR device (e.g., a Cu/HfO$_2$/p$^+$—Si MR device from the array 200 of FIG. 2). The inset plot 402 shows resealed R$_{off}$ values of plot 400 for the region indicated by the dashed lines, between approximately 3.2×10$^{-3}$ Torr and 4.9×10$^{-5}$ Torr.

The resistance for the MR vacuum sensor increases gradually as the pressure reduces until a pressure threshold value P$_{th}$ is reached. The threshold pressure 404 is about 5.5×10$^{-5}$ Torr. Below the threshold pressure 404, the resistance R$_{off}$ abruptly increases from 39 MΩ to 126 MΩ. Thus, in response to a change in vacuum pressure, the off-state resistance R$_{off}$ exhibits two distinct regimes: first, the resistance gradually increases as shown in the inset plot 402; and second, it abruptly increases beyond the threshold pressure P$_{th}$. The behavior of R$_{off}$ in the first region may be modeled as a power law. For the example device characterized by FIG. 4, the behavior in the first region may be modeled as 11.4x$^{-0.123}$. The parameters of the power law may be used to configure a controller (e.g., controller 104 of FIG. 1) of a pressure detection system (e.g., pressure detection system 100 of FIG. 1) to determine a rate of the change of the ambient pressure based on measured R$_{off}$ values.

The two distinct operating regimes allow the MR vacuum sensor to function as a vacuum pressure sensor (e.g., the ambient pressure decreasing) in the first region and as a vacuum detector (e.g., is the MR vacuum sensor in "high vacuum") in the second region. The change in the value of R$_{off}$ may not be affected by electrical biasing over long periods of time, so that the dependence of R$_{off}$ on pressure is consistent for different operational periods of an MR device.

The sensitivity of the vacuum pressure sensor in the gradual region may be calculated using equation (1):

$$S = \frac{\Delta R_{off}/R_{off_i}}{\Delta p} \quad (1)$$

where $\Delta R_{off}$ is the change in off-state resistance, $R_{off_i}$ is the initial resistance in air (approximately 27 MΩ) and $\Delta p$ is the change in pressure. For the example device characterized by FIG. 4, the sensitivity S is about 493 Torr$^{-1}$ in a pressure range from 1×10$^{-3}$ to 6×10$^{-5}$ Torr. Utilizing the change in R$_{off}$ as the quantitative parameter for sensing significantly reduces the power consumption of a vacuum sensor. The R$_{off}$ values of MR devices (e.g., array 200 of FIG. 2) are approximately 20-200 MΩ. At a read voltage of V$_{read}$=0.4 V, the maximum power is about 8 nW by using (2):

$$\text{Power} = \frac{V_{read}^2}{R_{off}} \quad (2)$$

Figure 5A:
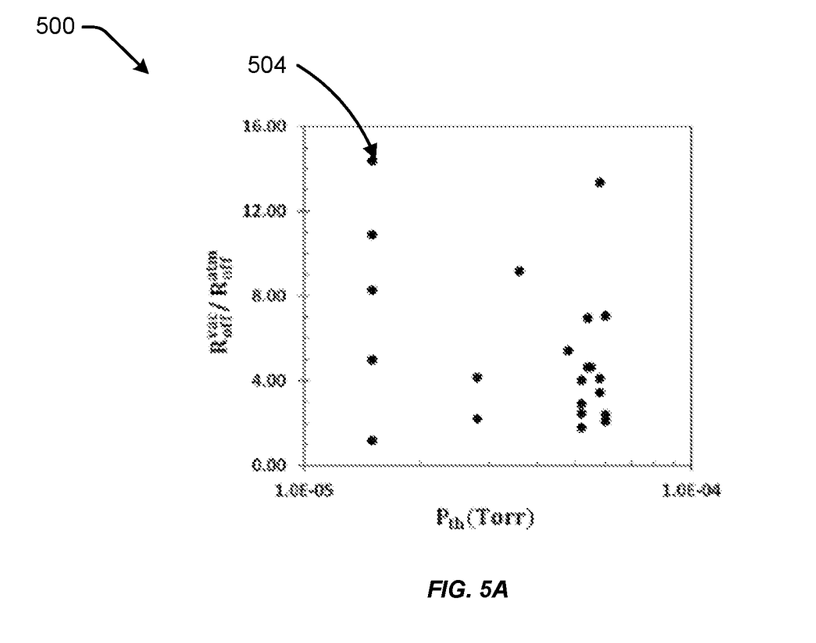
FIGS. 5A and 5B show a plot of the ratio of device resistance at vacuum pressure and at atmospheric pressure versus threshold pressure for multiple memristive vacuum sensor devices and a corresponding cumulative distribution function of the ratio values, according to some embodiments.

FIG. 5A shows a plot 500 of the ratios 504 of device resistance at vacuum pressure, R$_{off}^{vac}$, and at atmospheric pressure, R$_{off}^{atm}$, versus threshold pressure P$_{th}$ for multiple memristive vacuum sensor devices. The memristive vacuum sensor devices depicted in FIG. 5A may be examples of the devices of array 200 of FIG. 2. The distribution of the resistance ratios demonstrates device-to-device variability in both the critical threshold (e.g., threshold pressure 404 of FIG. 4) at which an abrupt increase in R$_{off}$ is observed.

Figure 5B:
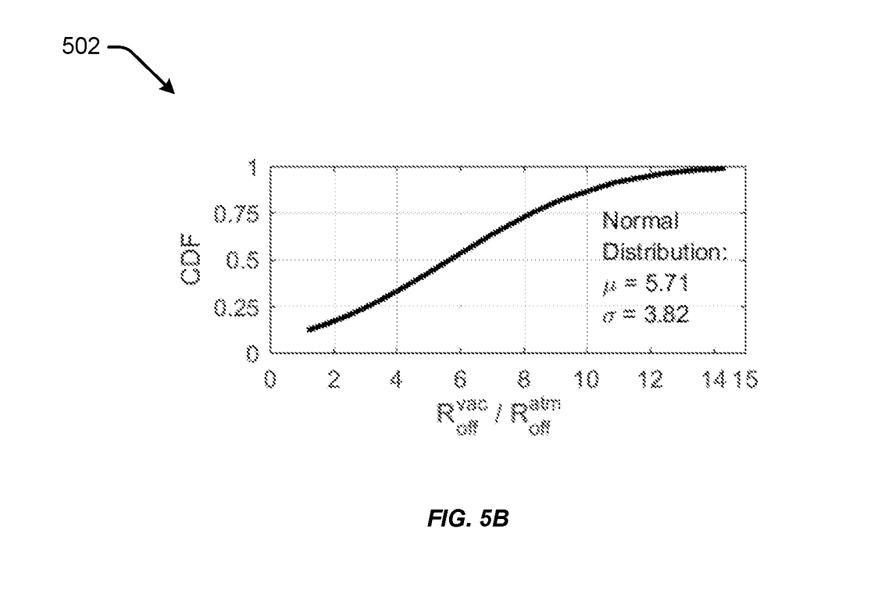

FIG. 5B shows a corresponding cumulative distribution function (CDF) of the ratio values of FIG. 5A. The CDF is the probability that the resistance ratio (in this case) assumes a value less than or equal to a given value x. That is, F(x) is the probability that the resistance ratio will be less than or equal to x. As seen in FIG. 5A, most MR devices exhibit a resistance ratio greater than 2 at the measured pressure threshold P$_{th}$ values. Based on the CDF shown in FIG. 5B, the probability that the resistance ratio will be greater than 2 is approximately 83%. Thus, the measured resistance ratio of the Cu/HfO$_2$/p$^+$—Si memristive devices is a reliable metric to distinguish a measurable change in the ambient pressure between atmosphere and vacuum (e.g., that an MR device is exposed to a "high vacuum").

Figure 6A:
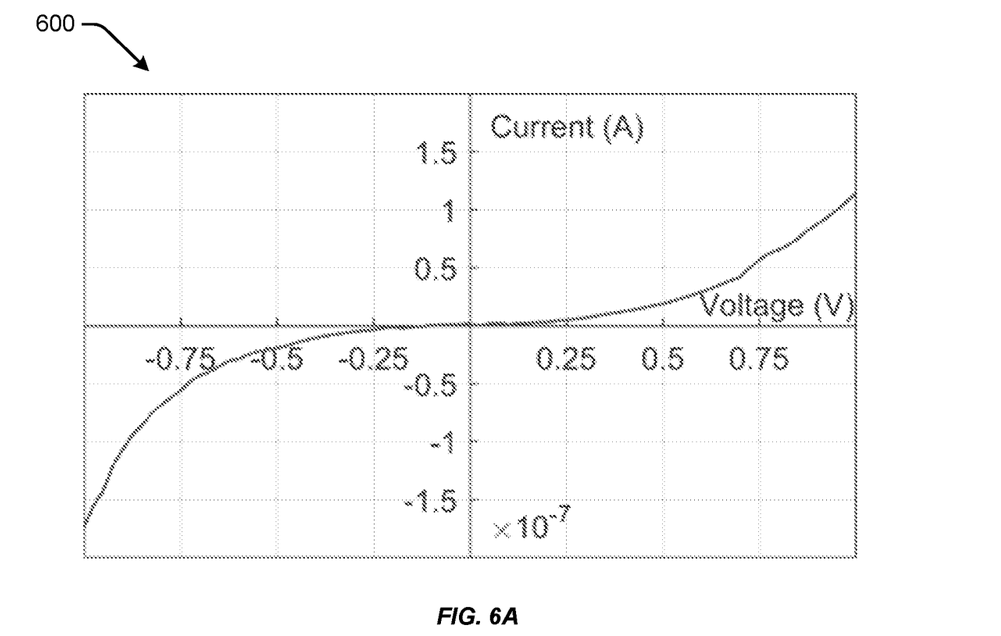
FIGS. 6A and 6B show an I-V plot and corresponding power-law fit of current versus voltage of an example memristive vacuum sensor, according to at least one embodiment.
Figure 6B:
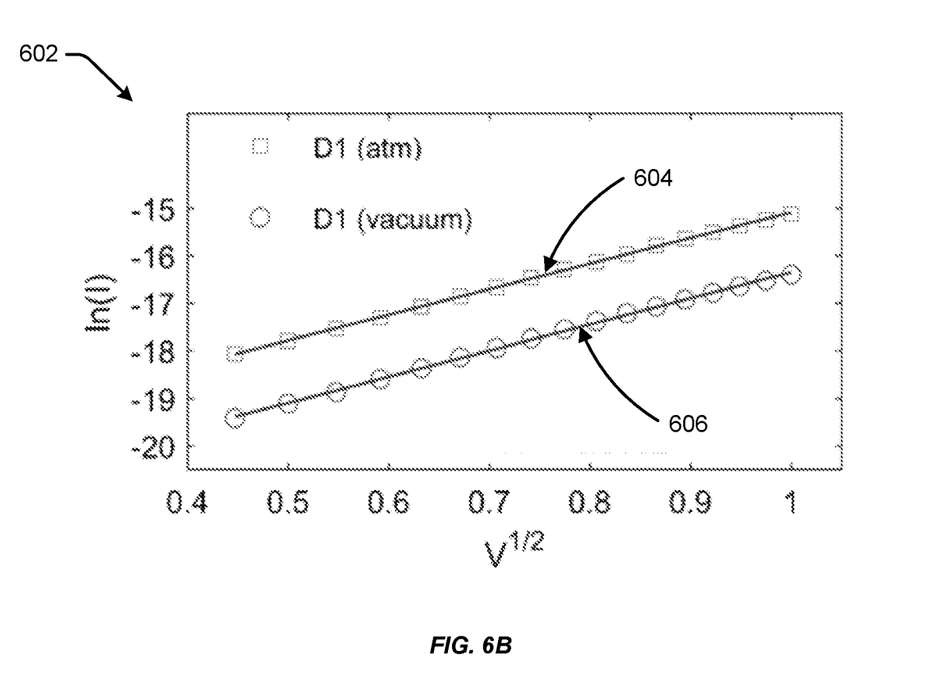

FIGS. 6A and 6B show an I-V plot 600 and corresponding power-law fit 602 of current versus voltage of an example memristive vacuum sensor, according to at least one embodiment.

The memristive vacuum sensor may be an example of any other memristive sensor described herein, including the exemplary MR devices described above with respect to FIGS. 2-5B. The vacuum pressure sensing mechanism of a Cu/HfO$_2$/p$^+$—Si memristor device may depend on a change in the electronic current conduction in the HRS. As shown in FIGS. 6A and 6B, an exemplary MR device can involve two Schottky barriers connected back-to-back with a series resistance. The current conduction in the HRS follows the Schottky emission, as evidenced by a linear dependence of ln(I) on V$^{1/2}$. The regression equations obtained for the linear fits 604, 606 to the data (solid lines) are also provided in FIG. 6B. The slope (a) and the y-intercept (b) of the linear regression equations (y=ax+b) are proportional to, respectively, the Schottky field-lowering coefficient ($\beta_s$) and the potential barrier at the interface under zero applied bias ($\varphi_0$) according to the Schottky emission equation (3):

$$I = AT^2 \exp\left(-\frac{\varphi_0}{k_B T}\right) \exp\left(\frac{\beta_S V^{1/2}}{k_B T d^{1/2}}\right) \quad (3)$$

where the constant A is the product of area and Richardson constant, T is the absolute temperature, $k_B$ is the Boltzmann constant, d the film thickness of the memristive material (e.g., 80 nm for the $HfO_2$ memristive material layer 204 of FIG. 2). The Schottky field-lowering coefficient $\beta_s$ is given by equation (4):

$$\beta_S = \left(\frac{e^3}{4\pi\varepsilon_r\varepsilon_0}\right)^{1/2} \quad (4)$$

where $\varepsilon_r$ is the relative permittivity of the memristive material and $\varepsilon_0$ is the permittivity of free space.

A comparison of the slope of the linear fits 604, 606 allows the comparison of $\beta_s$ for different devices and different ambient conditions. Different $\beta_s$ values may imply different relative permittivity of the $HfO_2$ film. Similarly, a comparison of the y-intercept allows the comparison of the potential barrier $\varphi_0$. The slopes and intercepts of the linear fits 604, 606 may differ for different devices under the same ambient conditions (e.g., ambient pressure), indicating the formation of different interface products and/or different formation amounts, as well as the formation of different bonding structures and molecules in the $HfO_2$ film that may occur during an electrical biasing operation. In addition, these structural variations may be existent in the as—fabricated devices to an extent. For the device characterized in FIGS. 6A and 6B, the slope is almost the same between atmosphere and vacuum (e.g., below the threshold pressure) suggesting little change in the field-lowering coefficient $\beta_s$ and thus little change in the relative permittivity $\varepsilon_r$ of the $HfO_2$ film. On the other hand, the intercept, which is proportional to $\varphi_0$, increases in vacuum, suggesting an increase in the barrier height to be the main source of reduced current conduction in vacuum. Compositional changes may also occur in the $HfO_2$ film, linked to the changes at the electrode interface that have led to an increase in the barrier height. Thus, a change in the series resistance of the $HfO_2$ film may also play a role in the changing electronic transport in vacuum.

Figure 7:
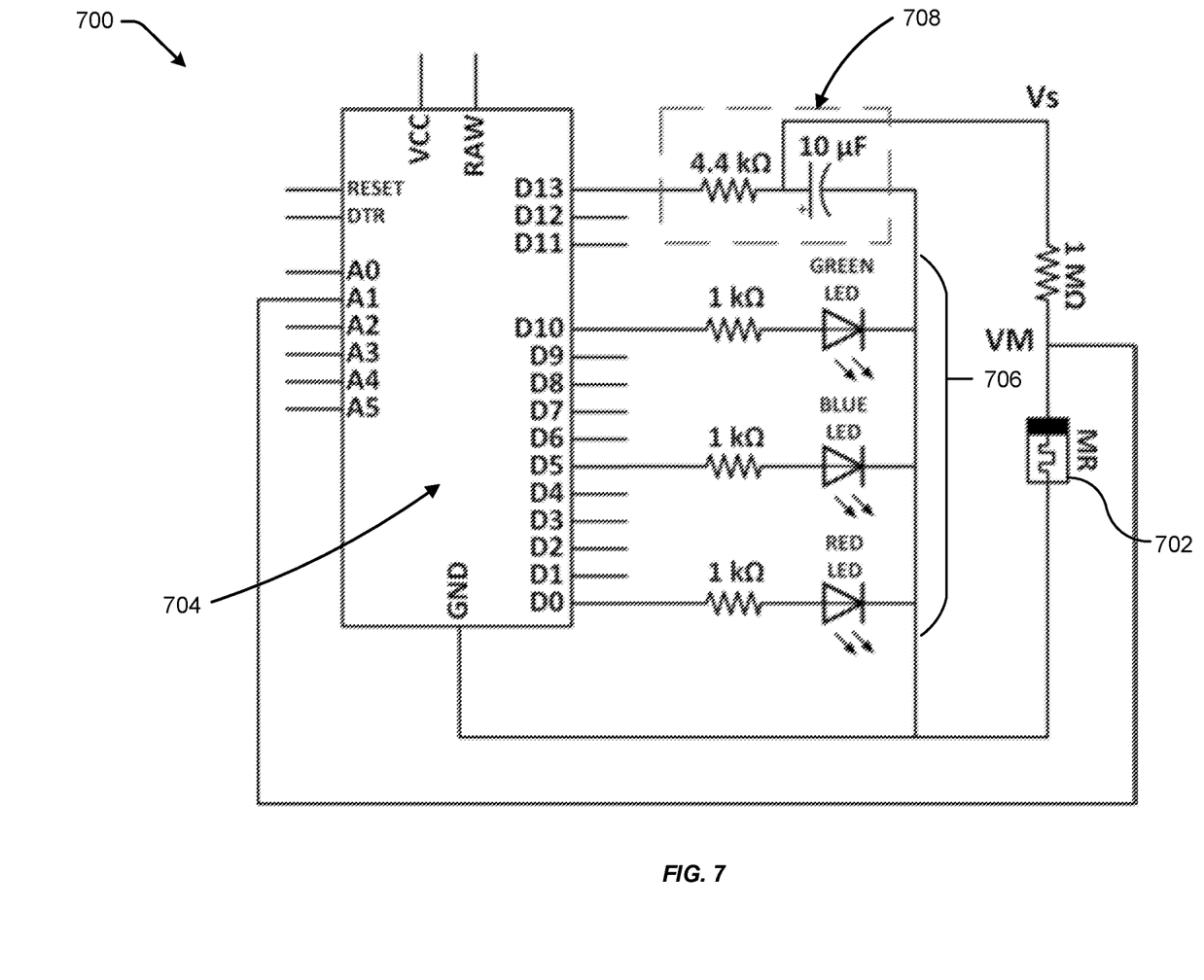
FIG. 7 depicts an example circuit schematic of an example system including a memristive vacuum sensor, according to an embodiment.

FIG. 7 depicts an example circuit schematic of an example system 700 including a memristive vacuum sensor 702, according to an embodiment. The system 700 may be similar to pressure detection system 100 described above with respect to FIG. 1. The system 700 can include a microcontroller 704, a low-pass filter 708, and an indicator array 706. In an embodiment, the microcontroller may be an Arduino Uno microcontroller (5 V and 16 MHz).

The microcontroller 704 may be configured to output a pulse-width-modulated (PWM) signal of a configurable amplitude and frequency. The low-pass filter 708 may be configured to filter the PWM output to apply an electrical signal approximating a constant voltage at the memristive vacuum sensor 702. The filter design parameters (resistor value 4.4 k$\Omega$ and capacitor value 10 μF) are selected to achieve adequate time response without affecting the output voltage. A 1 M$\Omega$ resistor may be connected in series with the memristive vacuum sensor 702 to determine the value of the current. The indicator array 706 can include LEDs to serve as pressure and/or leak indicators.

The potential difference across the memristive vacuum sensor 702 is read through the microcontroller 704 analog input (A1). The resistor connected in series with the memristor provides a voltage reference $V_m$ and it is used to determine the value of the current I using equation (5):

$$I = \frac{V_s - V_m}{R_1} \quad (5)$$

The value of $R_1$ is selected to be 1 M$\Omega$, which provides a suitable reference within the range of off-state resistance $R_{off}$ values of the sensor 702. The memristor resistance then can be found by using (6):

$$R_M = \frac{V_M}{I} \quad (6)$$

where $R_M$ is the resistance of the memristive vacuum sensor 702.

In some embodiments, the microcontroller 704 can be configured to operate the LEDs of the indicator array 706 to provide a leak-state indication. In this example, the resistance $R_M$ of the memristive vacuum sensor 702 is measured periodically. While the percentage of change in the resistance remains within a predetermined range, the microcontroller 704 can send an indication signal to the indicator array 706. The indication signal can be a voltage sufficient to power a green LED. Other LEDs of the indicator array may remain powered off, indicating that there is no significant leak. If the resistance starts increasing gradually, with a slope greater than a predetermined value (e.g., a predetermined acceptable leak-rate value), then the microcontroller 704 can send an indication signal to the indicator array 706 that turns the green LED off and turns the blue LED on, indicating a considerable leak rate. In the event of an abrupt change in the resistance (e.g., crossing the threshold pressure 404 of FIG. 4), the microcontroller 704 can send an indication signal to the indicator array 706 that can turn on the red LED to indicate that a critical leak state is reached and/or the memristive vacuum sensor 702 is now in vacuum. For instance, this indication level could be programmed to be at a resistance ratio of 2, above which 83% of the empirically derived ratios, $R_{off}^{vac}/R_{off}^{atm}$, lie.

Figure 8:
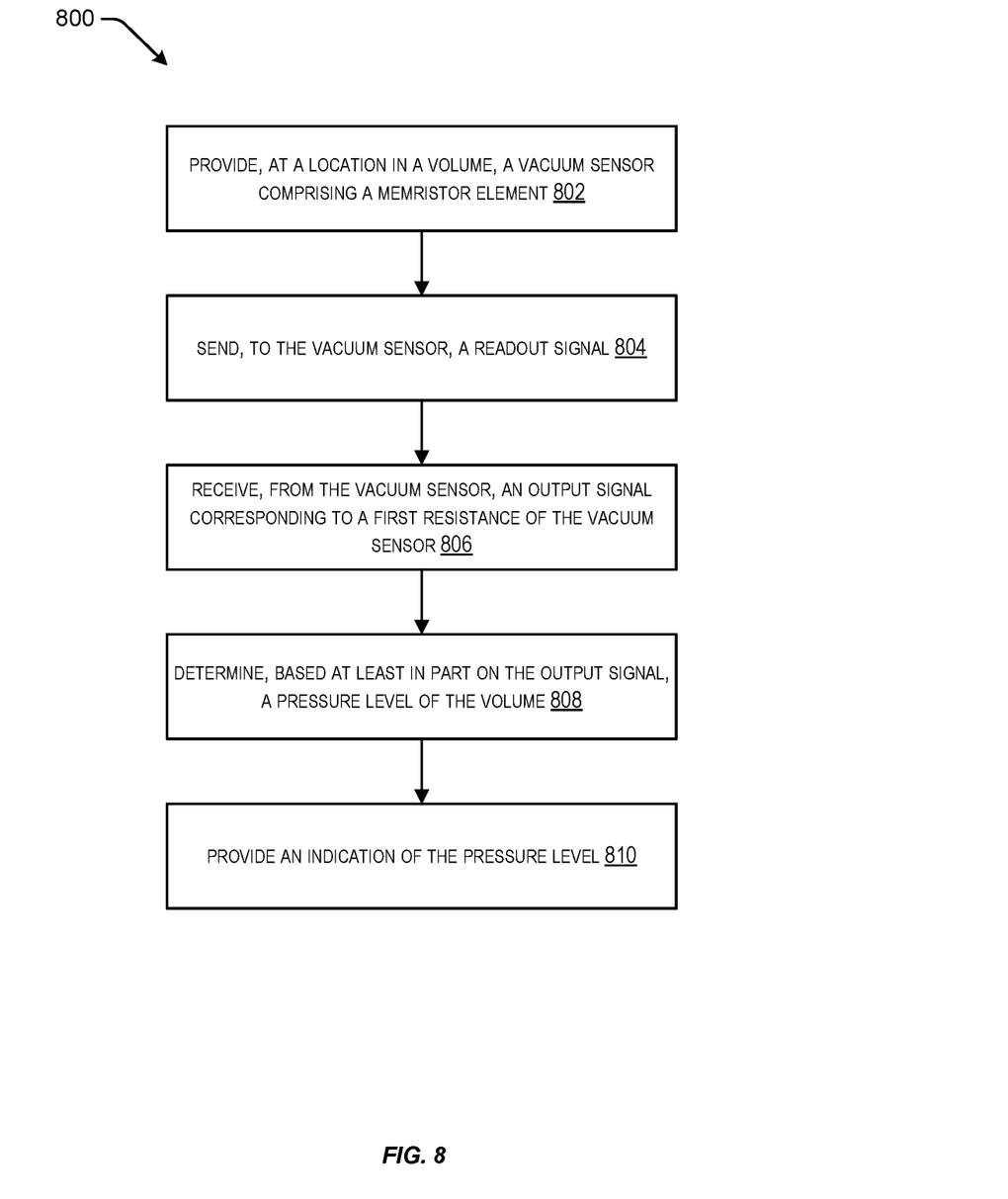
FIG. 8 is a flow diagram depicting an example method for detecting vacuum pressure in a volume, according to some embodiments.

FIG. 8 is a flow diagram depicting an example method 800 for detecting vacuum pressure in a volume, according to some embodiments. Operations of the method 800 can be performed by a computer, controller, or microcontroller, including controller 104 of FIG. 1 or microcontroller 704 of FIG. 7.

At operation 802, a vacuum sensor may be provided at a location in a volume. The vacuum sensor may be a memristive vacuum sensor (e.g., memristive vacuum sensor 702 of FIG. 7, other memristive sensor or device described herein) or may include a MR element, MR device, or similar device. The volume may be the interior of a vacuum chamber, pressure vessel (e.g., vessel 108 of FIG. 1), spacesuit, spacecraft, test chamber, or any similar vessel that for which pressure sensing and/or vacuum leak detection are desirable. In some embodiments, vacuum sensor may be present at the location in the volume so that providing the vacuum sensor can include establishing a connection between the vacuum sensor and a controller (e.g., controller 104 of FIG. 1), computer, or other portion of a pressure detection system.

At operation 804, a readout signal may be sent to the vacuum sensor. The readout signal may be generated by the controller. The readout signal may be a voltage pulse, a plurality of voltage pulses, a constant, direct current (DC) voltage, or similar signal. The readout signal may have a magnitude (e.g., an amplitude) sufficient to generate an electrical current through the vacuum sensor (e.g., generate an electrical current through the MR element of the vacuum sensor). If the readout signal is a voltage pulse, the pulse may have a short duration in order to limit the duration of the applied voltage to the MR element and therefore minimize the change to the resistance of the MR element due to the applied voltage.

At operation 806, an output signal may be received from the vacuum sensor. The output signal may be received by the controller. The output signal can correspond to a first resistance of the vacuum sensor, which may be the off-state (HRS) resistance $R_{off}$ of the MR element. In some embodiments, the first resistance is the resistance $R_{off}$ at the time that the MR element receives the readout signal (e.g., when the MR element is subject to an applied voltage signal). The output signal may be a current passing through the MR element and measured directly by the controller. In some embodiments, the output signal may be a reference voltage measured at the input of the vacuum sensor.

At operation 808, a pressure level of the volume can be determined. The controller may use the output signal to compute the first resistance, which may be correlated with an ambient pressure of the volume at the vacuum sensor. In some embodiments, the controller may be configured with a predetermined threshold resistance value that corresponds to the off-state resistance $R_{off}$ of the MR element at a vacuum threshold pressure $P_{th}$. Determining the pressure level of the volume can include comparing the $R_{off}$ computed using the output signal with the predetermined resistance to determine whether the vacuum sensor is exposed to a high vacuum state. In some embodiments, the threshold pressure may be about $4.9 \times 10^{-5}$ Torr. In some embodiments, the vacuum threshold pressure corresponds to an increase of the first resistance by a factor of about 2 (e.g., $R_{off}^{vac}/R_{off}^{atm} \approx 2$).

At operation 810, an indication of the pressure level may be provided. The indication may be a light (e.g., an LED), a digital readout, an audible alarm, or other similar indication. The controller may send an indication signal to an indicator to provide the indication (e.g., powering an LED).

In some embodiments, the method 800 can include the further operations of sending a second readout signal to the vacuum sensor and receiving a second output signal. The second readout signal may be a subsequent voltage pulse as a first readout signal. The second output signal may correspond to a second resistance of the vacuum sensor (e.g., the $R_{off}$ of the MR element at a subsequent time when the second readout signal is sent). The controller can then use the two readout signals to determine the two corresponding $R_{off}$ values. The controller can compare the readout signals to determine a rate of change of the off-state resistance $R_{off}$ of the MR element in the vacuum sensor and determine a corresponding pressure leak rate. If the leak rate exceeds a threshold rate (e.g., a predetermined allowable leak rate), then the controller can provide a leak indication. The leak indication can include powering a second LED (e.g., blue LED) of an indicator.

Various computational methods discussed above may be performed in conjunction with or using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described above. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like.

The particulars shown herein are by way of example and for purposes of illustrative discussion of the embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A pressure detection system comprising:
   a vacuum sensor comprising:
      a substrate;
      an oxide layer coupled to the substrate; and
      a conductive top electrode coupled to the oxide layer;
   an indicator;
   a controller electrically coupled to the vacuum sensor and the indicator, the controller configured to at least:
      provide a readout signal to the vacuum sensor;
      detect an output signal from the vacuum sensor, the output signal generated in response to the readout signal and corresponding to a resistance across the vacuum sensor measured from the conductive top electrode to the substrate; and
      send an indication signal to the indicator, the indication signal corresponding to a level of the output signal, the level of the output signal associated with a pressure at the vacuum sensor.

2. The pressure detection system of claim 1, wherein the indicator is configured to produce an indication corresponding to the output signal detected by the controller.

3. The pressure detection system of claim 1, wherein the indicator comprises a plurality of light emitting diodes, and wherein the indication signal is a voltage signal sufficient to power one of the plurality of light emitting diodes, thereby providing the indication.

4. The pressure detection system of claim 1, wherein the substrate comprises p-type silicon.

5. The pressure detection system of claim 1, wherein the oxide layer comprises hafnium oxide.

6. The pressure detection system of claim 1, wherein the conductive top electrode comprises a copper electrode formed on a portion of the oxide layer.

7. The pressure detection system of claim 1, wherein the readout signal is a voltage pulse.

8. The pressure detection system of claim 1, wherein the output signal is a voltage across the vacuum sensor from the conductive top electrode to the substrate.

9. A method of detecting pressure within a volume, the method comprising:
   providing, at a location in the volume, a vacuum sensor comprising a memristor element;
   sending, to the vacuum sensor, a readout signal;
   receiving, from the vacuum sensor responsive to the readout signal, an output signal corresponding to a first resistance of the vacuum sensor;
   determining, based at least in part on the output signal, a pressure level of the volume; and
   providing an indication of the pressure level.

10. The method of claim 9, further comprising:
    sending, to the vacuum sensor, a second readout signal;
    receiving, from the vacuum sensor responsive to the second readout signal, second output signal corresponding to a second resistance of the vacuum sensor;
    comparing the first output signal and the second output signal to determine a leak rate;
    determining whether the leak rate exceeds a threshold rate; and
    providing, based at least in part on a determination that the leak rate exceeds the threshold rate, a leak indication.

11. The method of claim 9, further comprising:
    determining, based at least in part on the output signal, whether the pressure level of the volume has fallen below a vacuum threshold pressure; and
    providing, based at least in part on a determination that the pressure level is below the vacuum threshold pressure, a vacuum indication.

12. The method of claim 11, wherein the vacuum threshold pressure is about $4.9 \times 10^{-5}$ Torr.

13. The method of claim 11, wherein the vacuum threshold pressure corresponds to an increase of the first resistance by a factor of about 2.

14. A vacuum sensor, comprising:
    a substrate;
    a transition metal oxide layer coupled to the substrate; and
    a conductive top electrode coupled to the oxide layer;
    wherein the transition metal oxide layer exhibits a pressure-sensitive off-state resistance $R_{off}$, and wherein a pressure sensitivity S for the off-state resistance $R_{off}$ is about 493 $Torr^{-1}$.

15. The vacuum sensor of claim 14, wherein the substrate comprises p-type silicon.

16. The vacuum sensor of claim 14, wherein the transition metal oxide layer comprises hafnium dioxide.

17. The vacuum sensor of claim 14, wherein the conductive top electrode comprises a copper electrode formed on a portion of the oxide layer.

18. The vacuum sensor of claim 14, wherein measuring the off-state resistance $R_{off}$ consumes about 8 nW of power.

* * * * *